United States Patent [19]

Nanri

[11] Patent Number: 4,987,444
[45] Date of Patent: Jan. 22, 1991

[54] METHOD AND APPARATUS FOR PREVENTING LIGHT SOURCE DEGRADATION IN AN EXPOSING APPARATUS EMPLOYING A HALOGEN LAMP

[75] Inventor: Seiji Nanri, Shiga, Japan

[73] Assignee: Dainippon Screen Mfg. Co., Ltd., Japan

[21] Appl. No.: 429,830

[22] Filed: Oct. 31, 1989

[30] Foreign Application Priority Data

Oct. 31, 1988 [JP] Japan ............................ 63-276569
Aug. 31, 1989 [JP] Japan ............................ 1-227139

[51] Int. Cl.$^5$ ............................................ G03B 27/72
[52] U.S. Cl. .......................................... 355/69; 355/77
[58] Field of Search ................ 355/68, 69, 77; 445/6; 315/358

[56] References Cited

U.S. PATENT DOCUMENTS 4,736,224 4/1988 Watanabe .................. 355/77 X

Primary Examiner—L. T. Hix
Assistant Examiner—D. Rutledge
Attorney, Agent, or Firm—Ostrolenk, Faber, Gerb & Soffen

[57] ABSTRACT

An apparatus for preventing degradation of a light source in an exposure apparatus using a halogen lamp as a light source includes an intermittent turning on circuit for intermittently turning on the halogen lamp, a counter for accumulating the intermittent on-time of the halogen lamp, a determining apparatus for determining whether or not the counted value has reached a prescribed value, and a circuit for keeping on the halogen lamp for realizing a halogen cycle. When the determining apparatus determines that accumulated value of the intermittent on-time of the halogen lamp has reached the prescribed value, the halogen lamp is kept on continuously for a period of time necessary for the halogen cycle.

19 Claims, 3 Drawing Sheets

METHOD AND APPARATUS FOR PREVENTING LIGHT SOURCE DEGRADATION IN AN EXPOSING APPARATUS EMPLOYING A HALOGEN LAMP

BACKGROUND OF THE INVENTION

1. Field of the Invention

The present invention relates to a method and apparatus for preventing degradation of a light source employed in an exposing apparatus such as a graphic arts contact printing machine, a graphic arts copy camera and so on. More specifically, the present invention relates to a method and apparatus for preventing degradation of an exposing apparatus employing a halogen lamp as a light source.

2. Description of the Related Art

A halogen lamp is a type of incandescent lamp. A single substance or a compound of a halogen element such as iodine, bromine, chlorine or the like is sealed in a bulb of the halogen lamp. The halogen lamp comprises a bulb 2 and a filament 3 formed of, for example, tungsten W provided in the bulb 2, as shown in FIG. 2. In the halogen lamp, the halogen element sealed in the bulb 2, for example iodine I, is combined with the tungsten W vaporized from the filament 3 to form tungsten halide $WI_2$. The tungsten halide $WI_2$ is decomposed into tungsten W and iodine I as the filament 3 is heated. Consequently, the tungsten W returns to the filament 3. This phenomenon is called a halogen cycle. Namely, in a halogen lamp, the light intensity is maintained stable for a long period of time by the repetition of the halogen cycle.

By contrast, in an ordinary incandescent lamp, the halogen cycle does not occur even if tungsten W is deposited on the wall 2a of the bulb 2. Consequently, the wall of the bulb becomes black and the intensity is gradually reduced with time.

The halogen lamp has the above described advantage. However, the halogen lamp was employed as a light source in a contact printing machine for daylight condition. The reason will be described in the following. The emission light spectrum of the halogen lamp includes the photosensitive wavelength range (about 400 nm) of the photosensitive material for daylight condition to which yellow light is the safe light. Therefore, the halogen lamp inherently has the intensity which can be used as the light source for a contact printing machine for daylight condition. However, on-time of an exposure apparatus is relatively short (2 to 10 seconds) which is not long enough for the circulation of the halogen cycle. Tungsten W is deposited at a portion of the bulb where the temperature is the lowest, turning the wall of the bulb black and accordingly, causing reduction of intensity.

Therefore, a metal halide lamp or the like has been used as the light source. A cooling apparatus, a spare lighting circuit, an explosion proof interlock circuit and the like must be provided when a metal halide lamp is used. Consequently, the light source apparatus for exposure as a whole becomes expensive.

SUMMARY OF THE INVENTION

Therefore, one object of the present invention is to employ a halogen lamp as a light source for exposure which has a relatively short on-time.

Another object of the present invention is to use a light source other than the metal halide lamp for exposure.

A further object of the present invention is to provide a copy camera for reproduction using a halogen lamp as a light source.

still further object of the present invention is to provide a method of preventing degradation of a light source in an exposure apparatus employing a halogen lamp.

The above described objects of the present invention can be attained by an exposure apparatus comprising: an intermittent lighting circuit for intermittently turning on a halogen lamp, an apparatus for finding an intermittent lighting accumulation value for the halogen lamp, a memory for storing a prescribed value defining a timing for starting turning-on of the lamp to enable a halogen cycle, and an apparatus for comparing the intermittent lighting accumulation value with the prescribed value. The comparing apparatus determines whether the intermittent lighting accumulation value reaches the prescribed value. The exposure apparatus further comprises an apparatus for keeping the halogen lamp continuously on for a prescribed time period for regaining intensity determined by characteristics of the halogen lamp after the comparing apparatus determines that the prescribed value is reached by the intermittent lighting accumulation value.

Since the exposure apparatus of the present invention comprises the above described components, a halogen lamp is turned on to carry out the halogen cycle when the accumulated value of the intermittent on-time of the halogen lamp reaches the prescribed value. Therefore, the halogen lamp (which is usually turned on intermittently) is kept on for a long period of time as needed.

As a result, the halogen lamp can be used as a light source for exposure which light source has relatively a short on-time.

In accordance with another aspect of the present invention, a method of preventing degradation of a light source in an exposure apparatus using a halogen lamp as a light source which lamp is degraded when intermittently turned on in a prescribed first time period and the intensity of which is regained when kept on for a second time period, comprises the steps of predetermining the total number of times of intermittently lighting the halogen lamp which substantially signifies the first time period, intermittently lighting the halogen lamp, accumulating the number of times the lamp is intermittently lighted, determining whether the number of accumulated times has reached the predetermined number, and turning on and keeping the halogen lamp continuously on for the second time period when the number of accumulated times lighting is determined to have reached the predetermined number. When it is determined that the number of accumulated times has reached the predetermined number (which substantially signifies the prescribed first time period), then the halogen lamp is kept on for a second time period to regain intensity. Therefore, a method of preventing degradation of the light source can be provided for an exposure apparatus employing a halogen lamp.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
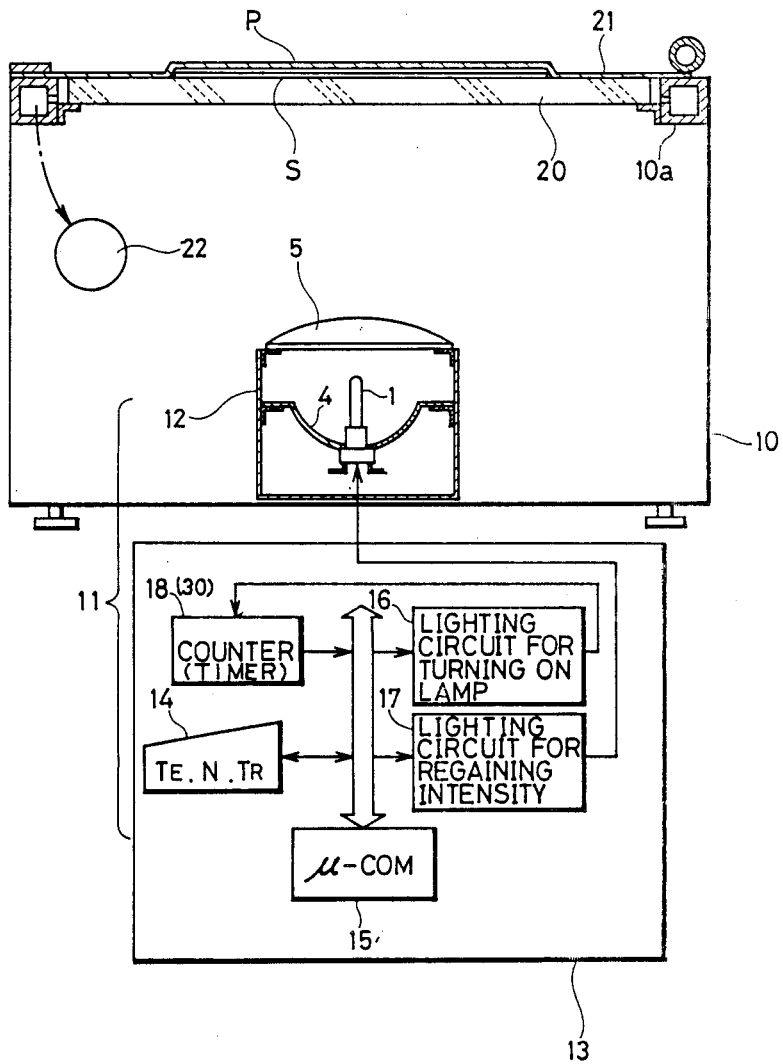
FIG. 1 is a schematic diagram of a graphic arts contact printing machine to which the exposure apparatus of the present invention is applied.
Figure 2:
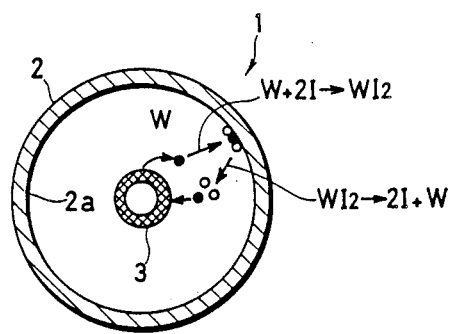
FIG. 2 is a view which schematically shows the inside of the halogen lamp.

Referring to FIG. 1, the graphic arts contact printing machine to which the exposure apparatus of the present invention is applied comprises a box housing 10, an exposure apparatus provided in the housing 10, a transparent plate 20 horizontally supported on the upper surface of the housing 10 by means of a support frame 10a, a rolled overlay sheet 21 which is to be spread over the transparent sheet 20 and an evacuating apparatus 22 provided connected to the support frame 10a. An original film S and a photosensitive material P placed overlaid in this order on the transparent plate 20 are covered with the overlay sheet 21. The air between the transparent plate 20 and the overlay sheet 21 is evacuated by the evacuating apparatus 22, whereby the original film S and the photosensitive material P are brought into contact with each other. The light source 1 is turned on and the original images on the original film S are exposed on the photosensitive material P.

The exposure apparatus 11 comprises a light source box 12 provided in a lower portion in the housing 10, a halogen lamp 1 provided in the light source box 12 and a control circuitry 13 for controlling the turning on/off of the halogen lamp 1. A concave reflection mirror 4 and a condenser lens 5 are provided for changing and improving the distribution of illumination and irradiation efficiency of the original film S.

The control circuitry 13 comprises an operation panel 14 through which the on-time for printing $T_E$, a prescribed number N of intermittent lighting and the on-time Tr for regaining intensity are inputted, a microcomputer 15, a lighting circuit 16 for turning on the halogen lamp 1 for printing, a lighting circuit 17 for regaining intensity of the halogen lamp 1, and a counter 18 for counting the number of times that the lamp 1 is intermittently turned on. The microcomputer 15 determines whether or not the accumulated value n has reached the prescribed number N by comparing a value counted by the counter 18 with the prescribed number N. When it is determined by the microcomputer that the accumulated value n has reached the prescribed number N, the result is indicated on an indicating member (not shown) on the operation panel 14. A warning may be given by means of a buzzer together with the indication. The operator turns on and keeps on the halogen lamp 1 for the above described set time period Tr in response to the indication or the warning.

The above prescribed number N changes dependent on various parameters such as the capacity of the halogen lamp, the time of each intermittent lighting, the diameter of the filament and so on. Therefore, it is necessary to set the number of times that the lamp is intermittently lighted in accordance with the color of the bulb which is turned black by the deposition of the tungsten halide.

Precisely, a time period T in which the blackening phenomenon is recognized is experimentally found in advance. Then, the above number times N is calculated by dividing that time period by an average time per one time of intermittent lighting. When the thus set number N is reached by the accumulated value n, the halogen lamp is turned on and kept on for a prescribed time period, for example, 5 min. Consequently, the tungsten halide $WI_2$ deposited on the wall of the bulb is heated to a high temperature, enabling full circulation of the halogen cycle.

For example, when a halogen lamp of 1 kW is intermittently turned on about 800 to 1000 times with the lamp kept on for 5 to 10 sec each time, then the tungsten halide $WI_2$ comes to be deposited on the wall of the bulb.

Figure 3:
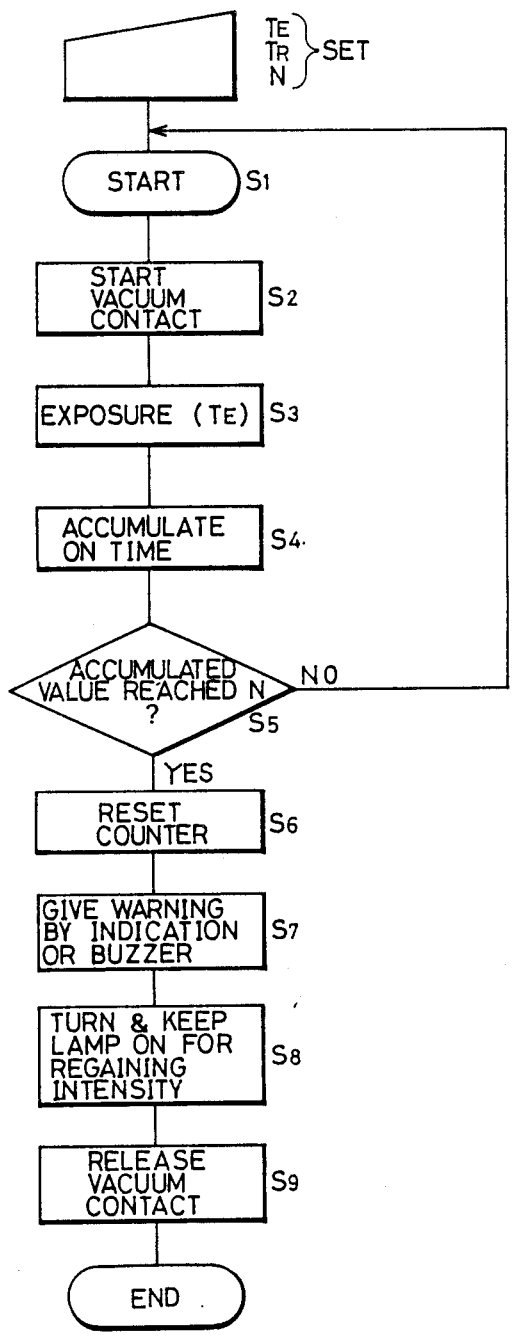
FIG. 3 is a flow chart showing the operation of the exposure apparatus in accordance with the present invention.

The operation of the microcomputer 15 will be described in the following with reference to FIG. 3. The on-time for printing $T_E$, the prescribed number of times N and the on-time $T_R$ for regaining intensity are set in advance through the operation panel 14. When a start button provided on the operation panel 14 is pressed (step S1), then the air between the transparent plate 20 and the overlay sheet 21 is evacuated (step S2). The original film S and the photosensitive material P are brought into vacuum contact. After a prescribed time period from the start of vacuum contact, exposure is carried out for a time period $T_E$ necessary for printing of the original S in the step S3. The number of times that the halogen lamp is accumulated (step S4). Thereafter, whether or not the accumulated value n has reached the prescribed time N is determined (step S5). When it is determined that the accumulated value n has reached the number N, then the counter is reset, and a warning is given by indication or buzzer to the operator (steps S6, S7). Then, the operator turns the halogen lamp up and keeps the lamp on continuously for a previously set on-time $T_R$ to regain the intensity of the halogen lamp (step S8). Then, the vacuum contact between the original film S and the photosensitive material P is released (step S9). If it is determined in the step S5 that the accumulated value n has not yet reached the prescribed number N, then the program returns to start the next exposure.

In the above described embodiment, the operator turns on and keeps on the halogen lamp every time a warning is given. Alternatively, the intensity regaining lighting circuit 17 shown in FIG. 1 may be automatically turned on based on the counter reset signal shown in the step S6 of the flow chart of FIG. 3. It is preferred, however, that the operator per se turn on and keep on the halogen lamp continuously for the time $T_R$ depending on operation environment, for example, where there is closely installed machine for exposing photosensitive materials that are not adapted for daylight room conditions and hence automatic lighting is undesired.

The prescribed number N is the number of times (for example 800 to 1000 times) at which the blackening phenomenon by the deposition of the tungsten halide on the bulb is recognized. The on-time $T_R$ is selected to be long enough to allow the bulb to be heated higher than 250° C. enabling sufficient recovery of the halogen cycle (about 2 to 5 min).

The effect of the present invention will be described in the following with reference to FIG. 4 in which the abscissa represents the number n of intermittent lighting while the ordinate represents the intensity. Every time the number n of reaches 1,000, the halogen lamp is turned and kept on for 5 min. Then the intensity of the halogen lamp is regained as shown by the solid line.

The solid line $G_1$ represents the intensity ($L_{ux}$) in a visible range, and $G_2$ represents the intensity ($L_{ux}$) in the blue light range. Dotted lines $G_1$ and $G_2$ represent cases where the intensity is not regained.

Figure 4:
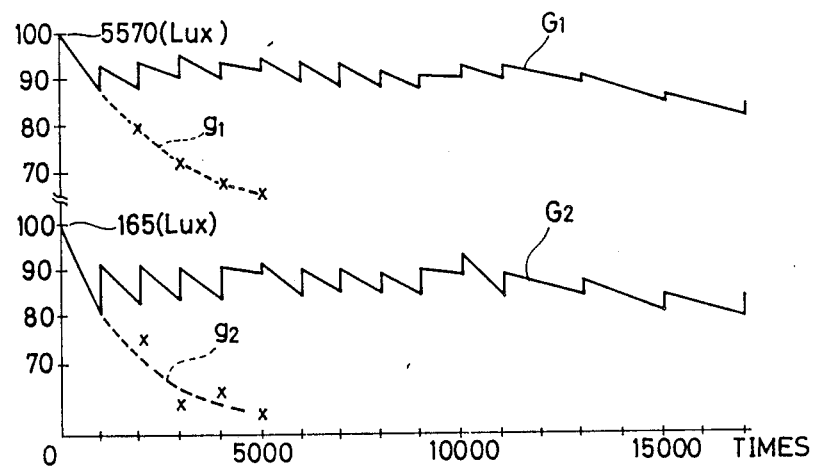
FIG. 4 is a graph showing the recovery of intensity of the halogen lamp in accordance with the present invention.

As is apparent from FIG. 4, the intensity of the halogen lamp is rapidly decreased when the lamp is not turned on for regaining intensity. When the lamp is kept on for regaining intensity, a relatively high intensity (no less than 80% of the initial intensity) can be maintained constantly for a long period of time.

Furthermore, it is apparent that the present invention is also effectively applicable for dark room conditions.

Although the exposure apparatus of the present invention is applied to a graphic arts contact printing machine in the foregoing, the present invention can be widely applied to copying machines, graphic arts cameras and so on in which on-time is relatively short.

The prescribed number N and the time $T_R$ for regaining intensity may be arbitrarily changed in accordance with the type of the halogen lamp.

According to another embodiment, an accumulation timer 30 is provided instead of the counter 18. In operation, there is set (through the operation panel 40) the above-described time period T (the time required for the blackening phenomenon to be recognized), instead of the number of times N. The time period for every intermittent lighting is accumulated by the accumulation timer 30 at step S4 in FIG. 3. The accumulated time periods are compared with the time period T by the microcomputer 15 at step S5. When the accumulated time periods reach the present time period T, the operation proceeds to steps S6 and S7, whereas to step S8 when such is not the case. The rest of the steps are conducted as in the first embodiment.

An accumulated value of the intermittent on-time is, for example, 2 hours ($\approx 7$ sec each time $\times 1,000$). In that case, the continuous on-time $T_R$ is about 5 min.

As described above, according to the present invention, when the accumulated value, i.e., the number of times, or the accumulated time periods, of intermittent lighting of the halogen lamp reaches a prescribed value and a blackening phenomenon is recognized in the bulb, the halogen lamp is kept on for a prescribed time period. Consequently, the halogen cycle is fully carried out. Consequently, the halogen lamp can be used as a light source whose on-time is relatively short.

As a result, compared with an exposure light source using a metal halide lamp or the like, a less expensive exposure apparatus can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposure apparatus, comprising:
   an intermittent lighting means for intermittently turning on a halogen lamp;
   means for finding an intermittent lighting accumulation value of said halogen lamp;
   memory means for storing a prescribed value defining a timing for starting turning-on of the lamp to enable a halogen cycle;
   means for comparing said intermittent lighting accumulation value with said prescribed value thereby to determine whether said intermittent lighting accumulation value has reached said prescribed value; and
   means for keeping said halogen lamp continuously on for a prescribed time period for regaining intensity determined by characteristics of said halogen lamp after said comparing means determines that said prescribed value has been reached by said intermittent lighting accumulation value.

2. An exposure apparatus according to claim 1, further comprising:
   warning means for giving a warning when said comparing means determines that said intermittent lighting accumulation value has reached said prescribed value.

3. An exposure apparatus according to claim 2, further comprising
   first input means for inputting said prescribed value and the prescribed time period for regaining intensity.

4. An exposure apparatus according to claim 1, further comprising
   means for automatically enabling the turning-on of the lamp for the halogen cycle when said comparing means determines that said intermittent lighting accumulation value has reached the prescribed value.

5. An exposure apparatus according to claim 4, further comprising
   first input means for inputting said prescribed value and the prescribed time period for regaining intensity.

6. An exposure apparatus according to claim 1, wherein
   said means for keeping the lamp continuously on comprises means for automatically turning said lamp on and for keeping said halogen lamp on in response to a starting signal yielded by said comparing means.

7. An exposure apparatus according to claim 6, further comprising
   first input means for inputting said prescribed value and the prescribed time period for regaining intensity.

8. An exposure apparatus according to claim 1, wherein said prescribed value is a period of time required for a blackening phenomenon in said halogen lamp to be recognized, and said finding means finds said intermittent lighting accumulation value by accumulating the time period of each intermittent turning-on of said lamp.

9. An apparatus according to claim 8, wherein said finding means comprises an accumulation-timer.

10. An apparatus according to claim 1, wherein said prescribed value is a number obtained by experimentally determining a time period required for a blackening phenomenon in said halogen lamp to be recognized and by dividing said experimentally determined time period by an average time period during which said halogen lamp is intermittently lighted, and said finding means finds said intermittent lighting accumulation value by accumulating the number of times said lamp is intermittently turned on.

11. An apparatus according to claim 10, wherein said finding means comprises a counter.

12. An exposure apparatus according to claim 10, further comprising
second input means for inputting said prescribed value.

13. An exposure apparatus according to claim 12, further comprising
means for automatically enabling the turning on of the lamp for the halogen cycle when said comparing means determines that said intermittent lighting accumulation value has reached said prescribed value.

14. An exposure apparatus according to claim 12, wherein
said means for keeping the lamp on is responsive to a signal yielded by said comparing means.

15. An exposure apparatus according to claim 14, further comprising
first input means for inputting said prescribed value and the prescribed time for regaining intensity.

16. A method of preventing degradation of a light source in an exposure apparatus using a halogen lamp as a light source which lamp is degraded when it is intermittently turned on for a prescribed first period of time and which regains intensity when it is kept on for a prescribed second period of time, comprising the steps of:
intermittently turning on said halogen lamp for exposure;
accumulating the on-time of the intermittently turned on lamp;
determining whether said accumulated time has reached said first period of time; and
turning said halogen lamp on and keeping said halogen lamp continuously on for said second period of time when it is determined that said accumulated time has reached said first period of time.

17. A method of preventing degradation of a light source in an exposure apparatus according to claim 16, further comprising the step of
giving a warning when said accumulated time has reached said first period of time.

18. A method of preventing degradation of a light source according to claim 16, further comprising, prior to the step of intermittently turning on said halogen lamp, the step of
previously defining said prescribed first and second periods of time.

19. A method of preventing degradation of a light source in an exposure apparatus using a halogen lamp as a light source which lamp is degraded when intermittently turned on for a prescribed first time period and which regains intensity when kept on for a second time period, comprising the steps of:
predetermining a total number of times of intermittently lighting said halogen lamp which substantially signifies said first time period;
intermittently lighting said halogen lamp;
counting the number of times said lamp is intermittently lighted;
determining whether said counted number has reached said predetermined number; and
turning said halogen lamp on and keeping said halogen lamp continuously on for said second time period when said counted number is determined to have reached said predetermined number.

* * * * *